US007720237B2

(12) United States Patent
Bharitkar et al.

(10) Patent No.: US 7,720,237 B2
(45) Date of Patent: May 18, 2010

(54) PHASE EQUALIZATION FOR MULTI-CHANNEL LOUDSPEAKER-ROOM RESPONSES

(75) Inventors: Sunil Bharitkar, Los Angeles, CA (US); Chris Kyriakakis, Altadena, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 1288 days.

(21) Appl. No.: 11/222,000

(22) Filed: Sep. 7, 2005

(65) Prior Publication Data

US 2006/0056646 A1 Mar. 16, 2006

Related U.S. Application Data

(60) Provisional application No. 60/607,602, filed on Sep. 7, 2004.

(51) Int. Cl.
*H03G 5/00* (2006.01)
*H04R 29/00* (2006.01)
*H04R 1/40* (2006.01)
*H04B 3/00* (2006.01)

(52) U.S. Cl. ............................ 381/98; 381/59; 381/80; 381/97

(58) Field of Classification Search .................. 381/99, 381/98, 97, 61, 94.1, 80, 59
See application file for complete search history.

(56) References Cited

U.S. PATENT DOCUMENTS 4,109,107 A 8/1978 Boast
4,694,498 A 9/1987 Suzuki et al.
4,771,466 A * 9/1988 Modafferi .................... 381/99
4,888,809 A 12/1989 Knibbeler
5,185,801 A 2/1993 Meyer et al.
5,377,274 A * 12/1994 Meyer et al. .................. 381/59
5,572,443 A 11/1996 Emoto et al.
5,771,294 A 6/1998 Inoue et al.
5,815,580 A 9/1998 Craven et al.
5,930,374 A * 7/1999 Werrbach et al. ............. 381/99
6,064,770 A 5/2000 Scarth et al.
6,072,877 A 6/2000 Abel
6,118,875 A 9/2000 Moller et al.
6,519,344 B1 2/2003 Yajima et al.
6,650,756 B1 11/2003 Saito et al.
6,650,776 B2 11/2003 Ihara et al.

(Continued)

OTHER PUBLICATIONS

Kumin, Daniel, Snell Acoustics RSC 1000 Room-Correction System, Audio, Nov. 1997, vol. 81, No. 11, pp. 96-102.

(Continued)

*Primary Examiner*—Vivian Chin
*Assistant Examiner*—Friedrich Fahnert
(74) *Attorney, Agent, or Firm*—Foley & Lardner LLP; Steven A. Moore

(57) ABSTRACT

A system and method for minimizing the complex phase interaction between non-coincident subwoofer and satellite speakers for improved magnitude response control in a cross-over region. An all-pass filter is cascaded with bass-management filters in at least one filter channel, and preferably all-pass filters are cascaded in each satellite speaker channel. Pole angles and magnitudes for the all-pass filters are recursively calculated to minimize phase incoherence. A step of selecting an optimal cross-over frequency may be performed in conjunction with the all-pass filtering, and is preferably used to select an optimal cross-over frequency prior to determining all-pass filter coefficients.

10 Claims, 11 Drawing Sheets

U.S. PATENT DOCUMENTS

| | | | |
|---|---|---|---|
| 6,721,428 | B1 | 4/2004 | Allred et al. |
| 6,760,451 | B1 * | 7/2004 | Craven et al. ................. 381/98 |
| 6,792,114 | B1 | 9/2004 | Kates et al. |
| 6,854,005 | B2 | 2/2005 | Thiele |
| 6,956,955 | B1 | 10/2005 | Brungart |
| 6,980,665 | B2 | 12/2005 | Kates |
| 7,158,643 | B2 | 1/2007 | Lavoie et al. |
| 2001/0038702 | A1 | 11/2001 | Lavoie et al. |
| 2003/0112981 | A1 | 6/2003 | McWilliam et al. |
| 2003/0200236 | A1 | 10/2003 | Hong |
| 2003/0235318 | A1 | 12/2003 | Bharitkar et al. |
| 2005/0031135 | A1 | 2/2005 | Devantier et al. |
| 2005/0069153 | A1 | 3/2005 | Hall et al. |
| 2005/0157891 | A1 | 7/2005 | Johansen |
| 2005/0220312 | A1 * | 10/2005 | Kasai et al. ................... 381/97 |

OTHER PUBLICATIONS http://www.snellacoustics.com/RSC1000.htm. Snell Acoustics RCS 1000 Digital Room Correction System.

Hatziantoniou, Panaglotis. Results for Room Acustics Based on Smooth Respnses. Audio Group. Electrical and Computer Engineering Department, University of Patras.

S.J. Elliott, Multiple-Point Equalization in a Room Using Adaptive Digital Filters. Journal of Audio Engineering Society, Nov. 1989, vol. 37, pp. 899-907.

B. Radlovic and R. A. Kennedy,Nonminimum-Phase Equalization and Its Subjective Importance in Room Acoustics IEEE Transactions on Speech and Audio Processing, vol. 8, No. 6, Nov. 2000.

Bhariktar, Sunil, A Classification Scheme For Acoustical Room Responses, IEEE, Aug. 2001, vol. 2, pp. 671-674.

Bharitkar, s., A Cluster Centroid Method for Room Respone Equilization at Multiple Locations., Applications of Signal Processing To Audio and Acoustics, Oct. 2001, pp. 55-58.

Bharitkar, Sunil and Kyriakakis, Chris, Multiple Point Room Response Equalization Using Clustering, Apr. 24, 2001, pp. 1-24.

International Search Report dated Oct. 3, 2003 for PCT/US03/16226.

* cited by examiner

PHASE EQUALIZATION FOR MULTI-CHANNEL LOUDSPEAKER-ROOM RESPONSES

The present application claims the benefit of U.S. Provisional Application Ser. No. 60/607,602, filed Sep. 7, 2004, which application is incorporated herein by reference. The present application further incorporates by reference the related patent application for "Cross-over Frequency Selection and Optimization of Response Around Cross-Over" filed on Sep. 7, 2005.

BACKGROUND OF THE INVENTION

The present invention relates to signal processing and more particularly to a use of all-pass filtering to correct the phase of speakers in a speaker system to improve performance in a cross-over region.

Modern sound systems have become increasingly capable and sophisticated. Such systems may be utilized for listening to music or integrated into a home theater system. One important aspect of any sound system is the speaker suite used to convert electrical signals to sound waves. An example of a modern speaker suite is a multi-channel 5.1 channel speaker system comprising six separate speakers (or electroacoustic transducers) namely: a center speaker, front left speaker, front right speaker, rear left speaker, rear right speaker, and a subwoofer speaker. The center, front left, front right, rear left, and rear right speakers (commonly referred to as satellite speakers) of such systems generally provide moderate to high frequency sound waves, and the subwoofer provides low frequency sound waves. The allocation of frequency bands to speakers for sound wave reproduction requires that the electrical signal provided to each speaker be filtered to match the desired sound wave frequency range for each speaker. Because different speakers, rooms, and listener positions may influence how each speaker is heard, accurate sound reproduction may require to adjusting or tuning the filtering for each listening environment.

Cross-over filters (also called bass-management filters) are commonly used to allocate the frequency bands in speaker systems. Because each speaker is designed (or dedicated) for optimal performance over a limited range of frequencies, the cross-over filters are frequency domain splitters for filtering the signal delivered to each speaker.

Common shortcomings of known cross-over filters include an inability to achieve a net or recombined amplitude response, when measured by a microphone in a reverberant room, which is sufficiently flat or constant around the cross-over region to provide accurate sound reproduction. For example, a listener may receive sound waves from multiple speakers such as a subwoofer and satellite speakers, which are at non-coincident positions. If these sound waves are substantially out of phase (viz., substantially incoherent), the waves may to some extent cancel each other, resulting in a spectral notch in the net frequency response of the audio system. Alternatively, the complex addition of these sound waves may create large variations in the magnitude response in the net or combined subwoofer and satellite response. Additionally, bass-management filters for each speaker, which are typically nonlinear phase Infinite Impulse Response (IIR) filters (for example, Butterworth design), may further introduce complex interactions during the additive process.

Room equalization has traditionally been approached as a classical inverse filter problem for compensating the magnitude responses, or for performing filtering in the time domain to obtain a desired convolution between a Room Transfer Function (RTF) and the equalization filter. Specifically, for each of the equalization filters, it is desired that the convolution of the equalization filter with the RTF, measured between a speaker and a given listener position, results in a desired target equalization curve. From an objective perspective, the target equalization curve is represented in the time domain by the Kronecker delta function. However, from a psychoacoustical perspective, subjectively preferred target curves may be designed based on the dimensions of the room and the direct to reverberant energy in the measured room response. For example, the THX® speaker system based X-curve is used as a target curve and movie theaters.

Although equalization may work well in simulations or highly controlled experimental conditions, when the complexities of real-world listening environments are factored in, the problem becomes significantly more difficult. This is particularly true for small rooms in which standing waves at low frequencies may cause significant variations in the frequency response at a listening position. Furthermore, since room responses may vary dramatically with listener position, room equalization must be performed, in a multiple listener environment (for example, home theater, the movie theater, automobile, etc.), with measurements obtained at multiple listening positions. Known equalization filter designs, for multiple listener equalization, have been proposed which minimizes the variations in the RTF at multiple positions. However, including an equalization filter for each channel for a single listener or multiple listeners, will not alleviate the issue of complex interaction between the phase of the non-coincident speakers, around the cross-over region, especially if these filters introduce additional frequency dependent delay.

BRIEF SUMMARY OF THE INVENTION

The present invention addresses the above and other needs by providing a system and method for minimizing the complex phase interaction between non-coincident subwoofer and satellite speakers for improved magnitude response control in a cross-over region. An all-pass filter is cascaded with bass-management filters in at least one filter channel, and preferably all-pass filters are cascaded in each satellite speaker channel. Pole angles and magnitudes for the all-pass filters are recursively calculated to minimize phase incoherence. A step of selecting an optimal cross-over frequency may be performed in conjunction with the all-pass filtering, and is preferably used to select an optimal cross-over frequency prior to determining all-pass filter coefficients.

In accordance with one aspect of the invention, there is provided a method for minimizing the spectral deviations in the cross-over region of a combined bass-managed subwoofer-room and bass-managed satellite-room response. The method comprises defining at least one second order all-pass filter having coefficients to reduce incoherent addition of acoustic signals produced by the subwoofer and the satellite speaker, the all-pass filter being in cascade with at least one of the satellite speaker filter and subwoofer bass-management filter. The coefficients of the all-pass filter are adapted by minimizing a phase response error, the error being a function of phase responses of the subwoofer-room response, the satellite-room response, and the subwoofer and satellite bass-management filter responses.

In accordance with another aspect of the invention, there is provided a method for computing all-pass filter coefficients. The method for computing all-pass filter coefficients comprises selecting initial values for pole angles and magnitudes, computing gradients $\nabla_{ri}$ and $\nabla_{\theta i}$ for pole angle and magnitude, multiplying the angle and magnitude gradients $\nabla_{ri}$ and $\nabla_{\theta i}$ times an error function J(n) and times adaptation rate control parameters $\mu_r$ and $\mu_\theta$ to obtain increments, adding the increments to the pole angles and magnitudes to recursively compute new pole angles and magnitudes, randomizing the pole magnitude if the pole magnitude is <1, and testing to determine if the pole angle and magnitudes have converged. If the if the pole angle and magnitudes have converged, the computing method is done, otherwise, the steps stating with computing gradients are repeated.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
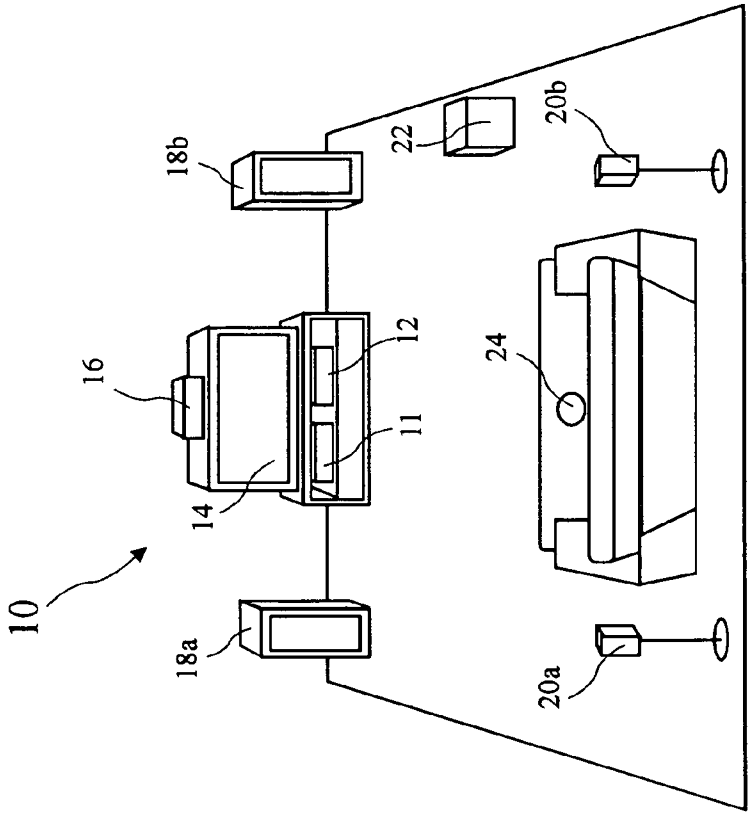
FIG. 1 is a typical home theater layout.

A typical home theater 10 is shown in FIG. 1. The home theater 10 comprises a media player (for example, a DVD player) 11, a signal processor 12, a monitor (or television) 14, a center speaker 16, left and right front speakers 18*a* and 18*b* respectively, left and right rear (or surround) speakers 20*a* and 20*b* respectively (the speakers 16, 18*a*, 18*b*, 20*a*, and 20*b* subsequently referred to as satellite speakers), a subwoofer speaker 22, and a listening position 24. The media player 11 provides video and audio signals to the signal processor 12. The signal processor 12 in often an audio video receiver including a multiplicity of functions, for example, a tuner, a pre-amplifier, a power amplifier, and signal processing circuits (for example, a family of graphic equalizers) to condition (or color) the speaker signals to match a listener's preferences and/or room acoustics.

Figure 2:
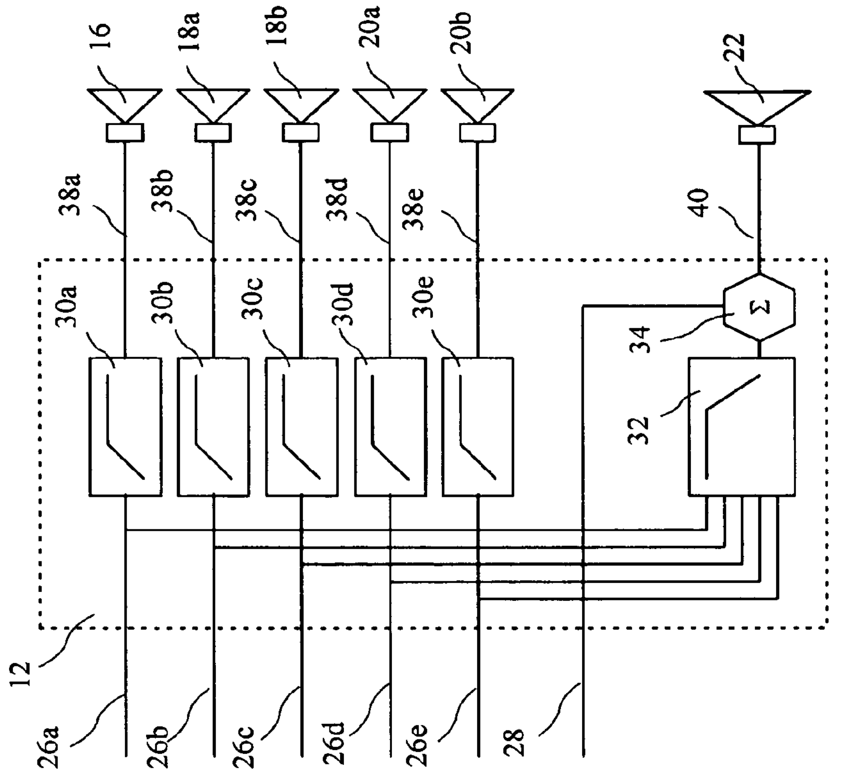
FIG. 2 (prior art)
FIG. 2 is a prior art signal processing flow for a home theater speaker suite.

Signal processors 12 used in home theater systems 10, which home theater systems 10 includes a subwoofer 22, also generally include cross-over filters 30*a*-30*e* and 32 (also called bass-management filters) as shown in FIG. 2. The subwoofer 22 is designed to produce low frequency sound waves, and may cause distortion if it receives high frequency electrical signals. Conversely, the center, front, and rear speakers 16, 18*a*, 18*b*, 20*a*, and 20*b* are designed to produce moderate and high frequency sound waves, and may cause distortion if they receive low frequency electrical signals. To reduce the distortion, the unfiltered (or full-range) signals 26*a*-26*e* provided to the speakers 16, 18*a*, 18*b*, 20*a*, and 20*b* are processed through high pass filters 30*a*-30*e* to generate filtered (or bass-managed) speaker signals 38*a*-38*e*. The same unfiltered signals 26*a*-26*e* are processed by a lowpass filter 32 and summed with a subwoofer signal 28 in a summer 34 to generate a filtered (or bass-managed) subwoofer signal 40 provided to the subwoofer 22.

Figure 3:
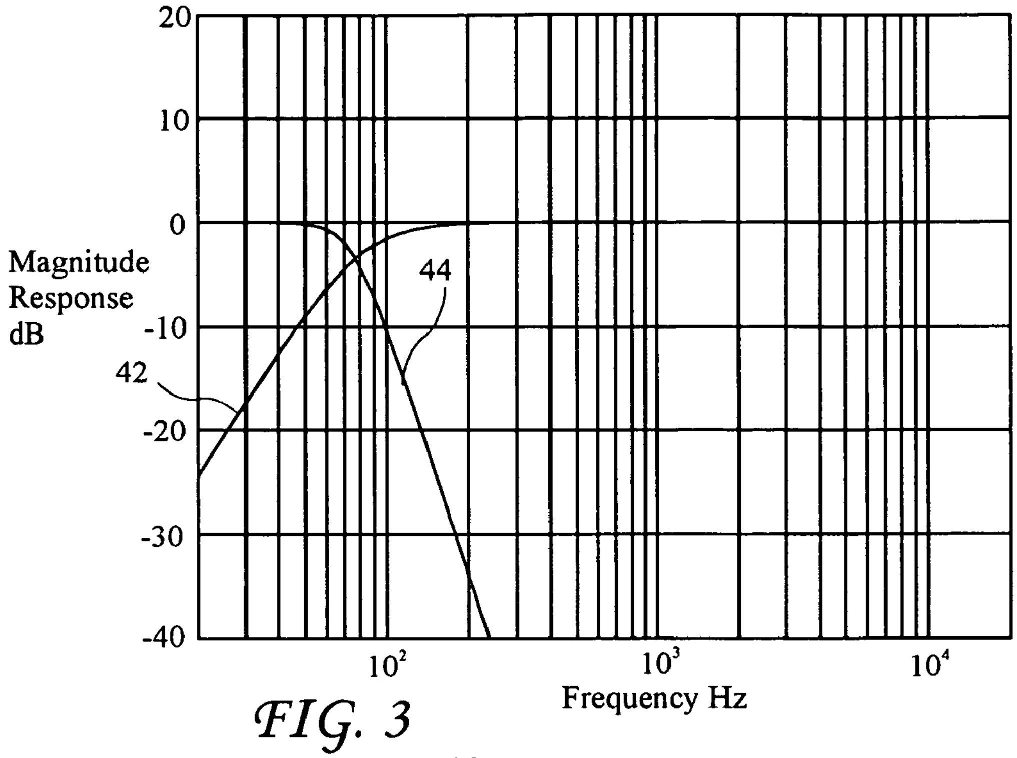
FIG. 3 shows typical magnitude responses for a speaker of the speaker suite.

An example of a system including a prior art signal processor 12 as described in FIG. 2 is a THX® certified speaker system. The frequency responses of THX® bass-management filters for subwoofer and satellite speakers of such THX® certified speaker system are shown in FIG. 3. Such THX® speaker system certified signal processors are designed with a cross-over frequency (i.e., the 3 dB point) of 80 Hz and include a bass management filter 32 preferably comprising a fourth order low-pass Butterworth filter (or a dual stage filter, each stage being a second order low-pass Butterworth filter) having a roll off rate of approximately 24 dB/octave above 80 Hz (with low pass response 44), and high pass bass management filters 30*a*-30*e* comprising a second order Butterworth filter having a roll-off rate of approximately 12 DB per octave below 80 Hz (with high pass response 42).

Figure 4A:
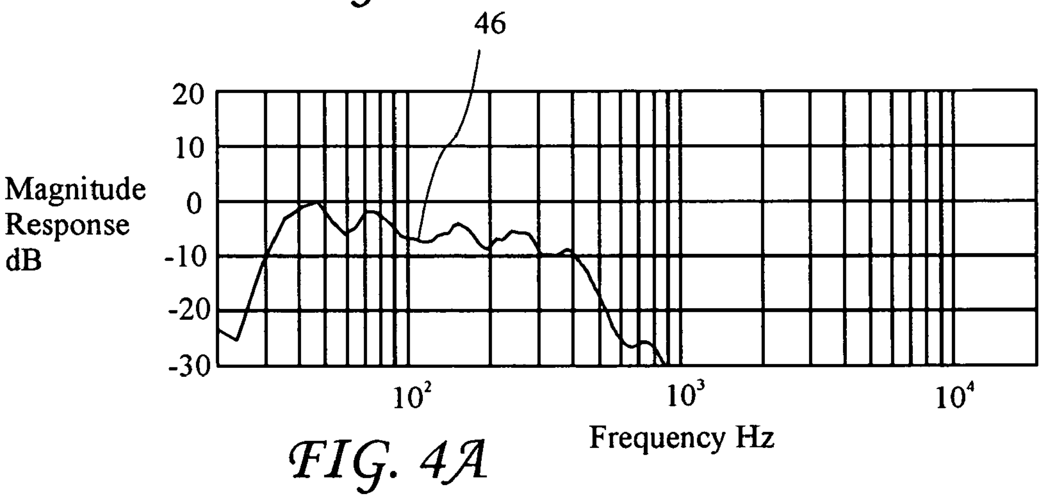
FIG. 4A is a frequency response for a subwoofer.
Figure 4B:
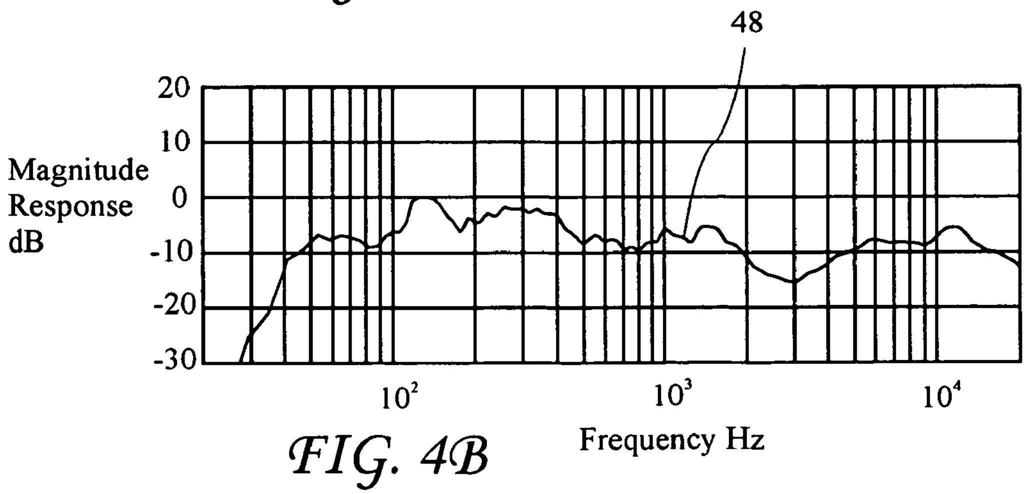
FIG. 4B is a frequency response for a speaker.

While such THX® speaker system certified signal processors conform to the THX® speaker system standard, many speaker systems do not include THX® speaker system certified signal processors. Such non-THX® systems (and even THX® speaker systems) often benefit from selection of a cross-over frequency dependent upon the signal processor 12, satellite speakers 16, 18*a*, 18*b*, 20*a*, 20*b*, subwoofer speaker 22, listener position, and listener preference. In the instance of non-THX® speaker systems, the 24 dB/octave and 12 dB/octave filter slopes (see FIG. 3) may still be utilized to provide adequately good performance. For example, individual subwoofer 22 and non-subwoofer speaker (in this example the center channel speaker 16 in FIG. 2) full-range (i.e., non bass-managed or without high pass or low pass filtering) frequency responses (one third octave smoothed), as measured in a room with reverberation time $T_{60}$ of approximately 0.75 seconds, are shown in FIGS. 4A and 4B respectively. As can be seen, the center channel speaker 16 has a center channel frequency response 48 extending below 100 Hz (down to about 40 Hz), and the subwoofer 22 has a subwoofer frequency response 46 extending up to about 200 Hz.

Figure 5:
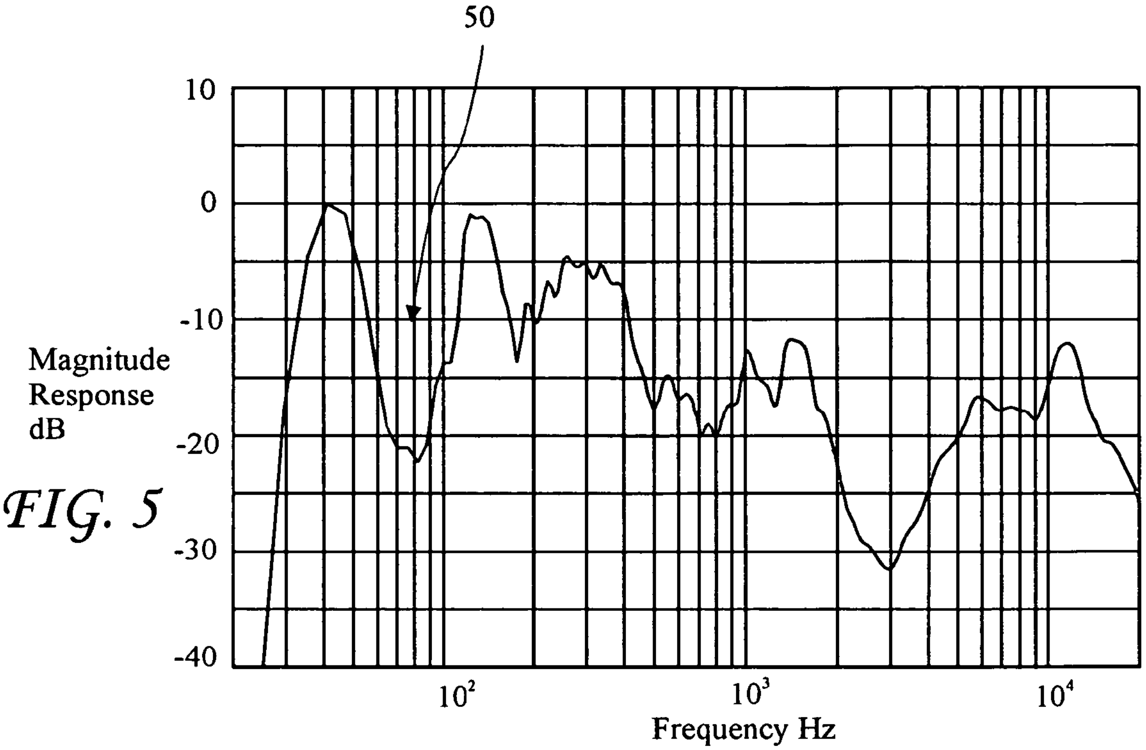
FIG. 5 is a combined subwoofer and speaker magnitude response having a spectral notch.

The satellite speakers 16, 18_a_, 18_b_, 20_a_, 20_b_, and subwoofer speaker 22, as shown in FIG. 1 generally reside at different positions around a room, for example, the subwoofer 22 may be at one side of the room, while the center channel speaker 16 is generally position near the monitor 14. Due to such non-coincident positions of the speakers, the sound waves near the cross-over frequency may add incoherently (i.e., at or near 180 degrees out of phase), thereby creating a spectral notch 50 and/or other substantial amplitude variations in the cross-over region shown in FIG. 5. Such spectral notch 50 and/or amplitude variations may further vary by listening position 24, and more specifically by acoustic path differences from the individual satellite speakers and subwoofer speaker to the listening position 24.

The spectral notch 50 and/or amplitude variations in the cross-over region may contribute to loss of acoustical efficiency because some of the sound around the cross-over frequency may be undesirably attenuated or amplified. For example, the spectral notch 50 may result in a significant loss of sound reproduction to as low as 40 Hz (about the lowest frequency which the center channel speaker 16 is capable of producing). Such spectral notches have been verified using real world measurements, where the subwoofer speaker 22 and satellite speakers 16, 18_a_, 18_b_, 20_a_, and 20_b_ were excited with a broadband stimuli (for example, log-chirp signal) and the net response was de-convolved from the measured signal.

Figure 6:
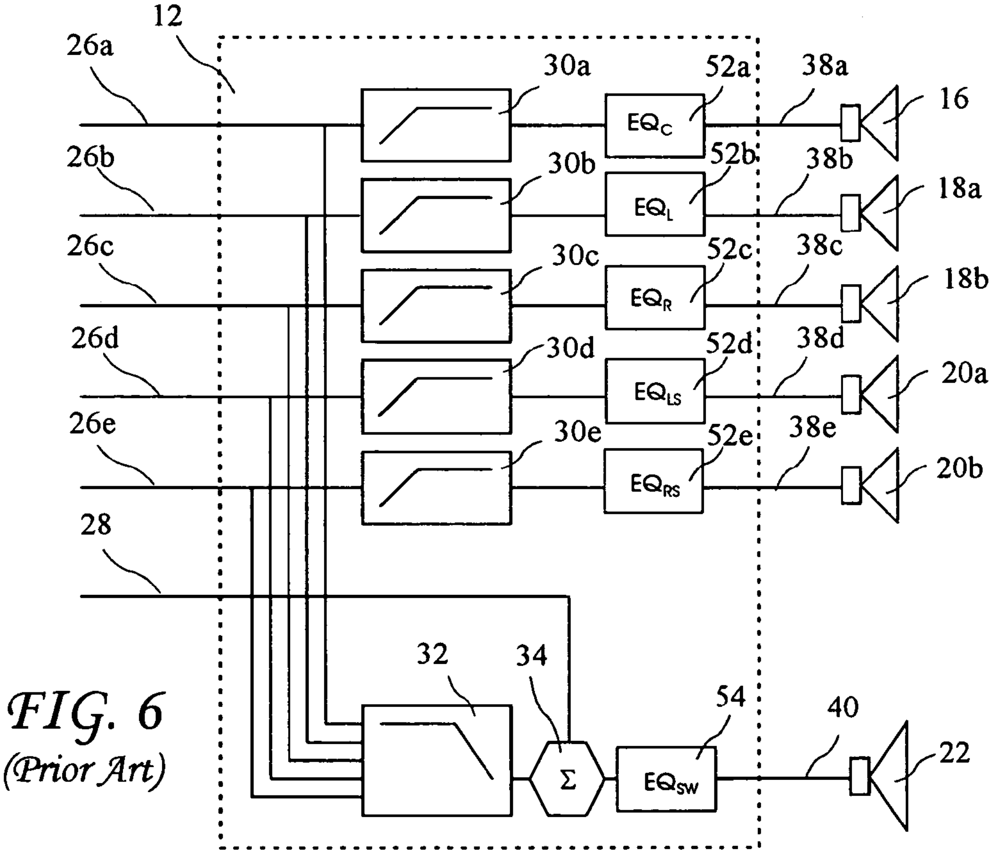
FIG. 6 (Prior Art)
FIG. 6 is a signal processing flow for a prior art signal processor including equalization filters.

Further, known signal processors 12 may include equalization filters 52_a_-52_e_, and 54, as shown in FIG. 6. Although the equalization filters 52_a_-52_e_, and 54 provides some ability to tune the sound reproduction for a particular room environment and/or listener preference, the equalization filters 52_a_-52_e_, and 54 do not generally remove the spectral notch 50, nor do they minimize the variations in the response in the cross-over region. In general, the equalization filters 52_a_-52_e_, and 54 are minimum phase and as such often do little to influence the frequency response around the cross-over.

The present invention provides a system and method for minimizing the spectral notching 50 and/or response variations in the cross-over region. While the embodiment of the present invention described herein does not describe the application of the present invention to systems including equalization filters for each channel, the method of the present invention is easily extended to such systems.

The home theater 10 generally resides in a room comprising an acoustic enclosure which can be modeled as a linear system whose behavior at a particular listening position is characterized by a time domain impulse function, h(n); n {0, 1, 2, . . . }. The impulse response h(n) is generally called the room impulse response which has an associated frequency response, $H(e^{j\omega})$ which is a function of frequency (for example, between 20 Hz and 20,000 Hz). $H(e^{j\omega})$ is generally referred to the Room Transfer Function (RTF). The time domain response h(n) and the frequency domain response RTF are linearly related through the Fourier transform, that is, given one we can find the other via the Fourier relations, wherein the Fourier transform of the time domain response yields the RTF. The RTF provides a complete description of the changes the acoustic signal undergoes when it travels from a source to a receiver (microphone/listener). The RTF may be measured by transmitting an appropriate signal, for example, a logarithmic chirp signal, from a speaker, and deconvolving a response at a listener position. The impulse responses h(n) and $H(e^{j\omega})$ yield a complete description of the changes the acoustic signal undergoes when it travels from a source (e.g. speaker) to a receiver (e.g., microphone/listener). The signal at a listening position 24 consists of direct path components, discrete reflections which arrive a few milliseconds after the direct path components, as well as reverberant field components.

The nature of the phase interaction between speakers may be understood through the complex addition of frequency responses (i.e., time domain edition) from linear system theory. Specifically, the addition is most interesting when observed through the magnitude response of the resulting addition between subwoofer and satellite speakers. Thus, given the bass-managed subwoofer response $\tilde{H}_{sub}e^{j\omega}$ and bass managed satellite speaker response as $\tilde{H}F_{sat}e^{j\omega}$, the resulting squared magnitude response is:

$$|He^{j\omega}|^2 = |\tilde{H}_{sub}(\omega)|^2 + |\tilde{H}_{sat}(\omega)|^2 + |\tilde{H}_{sub}(\omega)|\cdot|\tilde{H}_{sat}(\omega)|e^{j(\phi_{sub}(\omega)-\phi_{sat}(\omega))} + |\tilde{H}_{sub}(\omega)|\cdot|\tilde{H}_{sat}(\omega)|e^{-j(\phi_{sub}(\omega)-\phi_{sat}(\omega))}$$

$$|He^{j\omega}|^2 = |\tilde{H}_{sub}e^{j\omega} + \tilde{H}_{sat}e^{j\omega}|^2$$

$$|He^{j\omega}|^2 = (\tilde{H}_{sub}e^{j\omega} + \tilde{H}_{sat}e^{j\omega})\cdot(\tilde{H}_{sub}e^{j\omega} + \tilde{H}_{sat}e^{j\omega})^t$$

$$|He^{j\omega}|^2 = |\tilde{H}_{sub}(\omega)|^2 + |\tilde{H}_{sat}(\omega)|^2 + 2|\tilde{H}_{sub}(\omega)|\cdot|\tilde{H}_{sat}(\omega)|\cdot\cos(\phi_{sub}(\omega) - \phi_{sat}(\omega))$$

where $\tilde{H}_{sub}e^{j\omega}$ and $\tilde{H}_{sat}e^{j\omega}$ are bass-managed subwoofer and satellite room responses measured at a listening position l in the room, and where $A^t(e^{j\omega})$ is the complex conjugate of $A(e^{j\omega})$. The phase response of the subwoofer 22 and the satellite speaker 16, 18_a_, 18_b_, 20_a_, or 20_b_ are given by $\phi_{sub}(\omega)$ and $\phi_{sat}(\omega)$ respectively. Furthermore, $\tilde{H}_{sub}(e^{j\omega})$ and $\tilde{H}_{sat}(e^{j\omega})$ may be expressed as:

$$\tilde{H}_{sub}(e^{j\omega})=BM_{sub}(e^{j\omega})H_{sub}(e^{j\omega})$$

and, $$\tilde{H}_{sat}(e^{j\omega})=BM_{sat}(e^{j\omega})H_{sat}(e^{j\omega})$$

where $BM_{sub}(e^{j\omega})$ and $BM_{sat}(e^{j\omega})$ are the THX® bass-management Infinite Impulse Response (IIR) filters, and $H_{sub}(e^{j\omega})$ and $H_{sat}(e^{j\omega})$ are the full-range subwoofer and satellite speaker responses respectively.

The influence of phase on the net amplitude response is via the additive term:

$$\Lambda(e^{j\omega})=2|H_{sub}(e^{j\omega})||H_{sat}(e^{j\omega})|\cos(\phi_{sub}(\omega)-\phi_{sat}(\omega))$$

This term influences the combined magnitude response, generally, in a detrimental manner, when it adds incoherently to the magnitude response sum of the subwoofer and satellite speakers. Specifically, when:

$$\phi_{sub}(\omega)=\phi_{sat}(\omega)+k\pi(k=1, 3, 5, \ldots)$$

Figure 7:
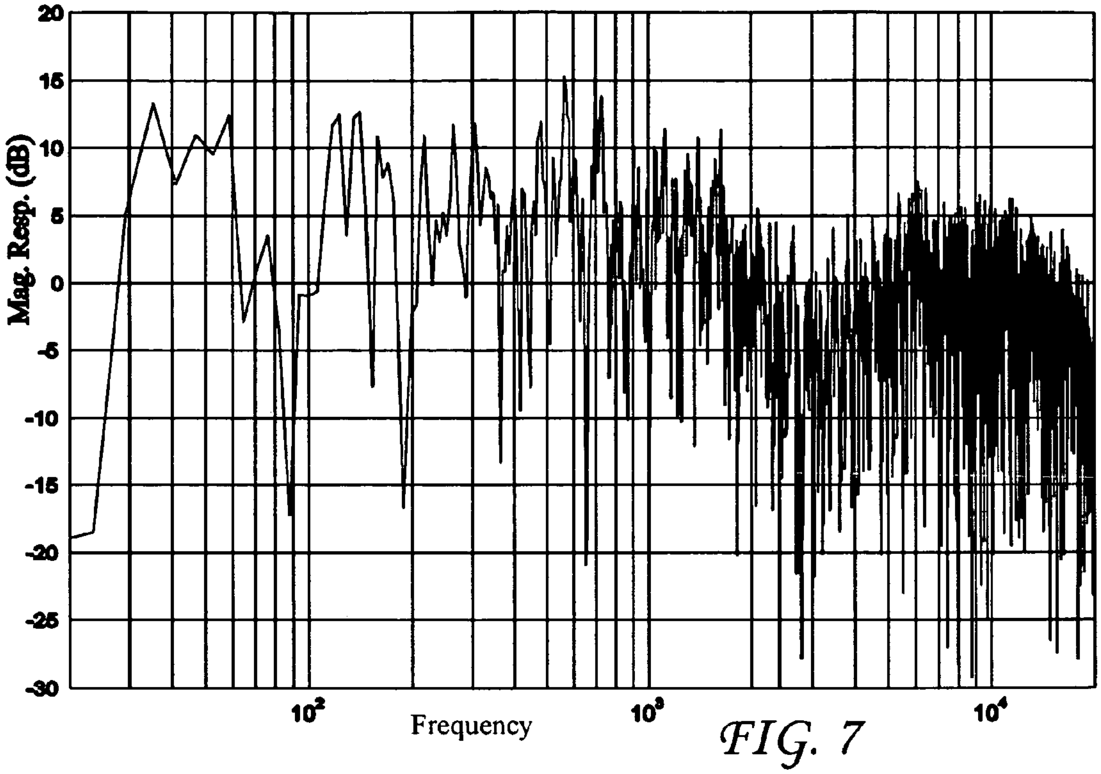
FIG. 7 is a combined speaker and subwoofer magnitude response for a cross-over frequency of 30 Hz.
Figure 8:
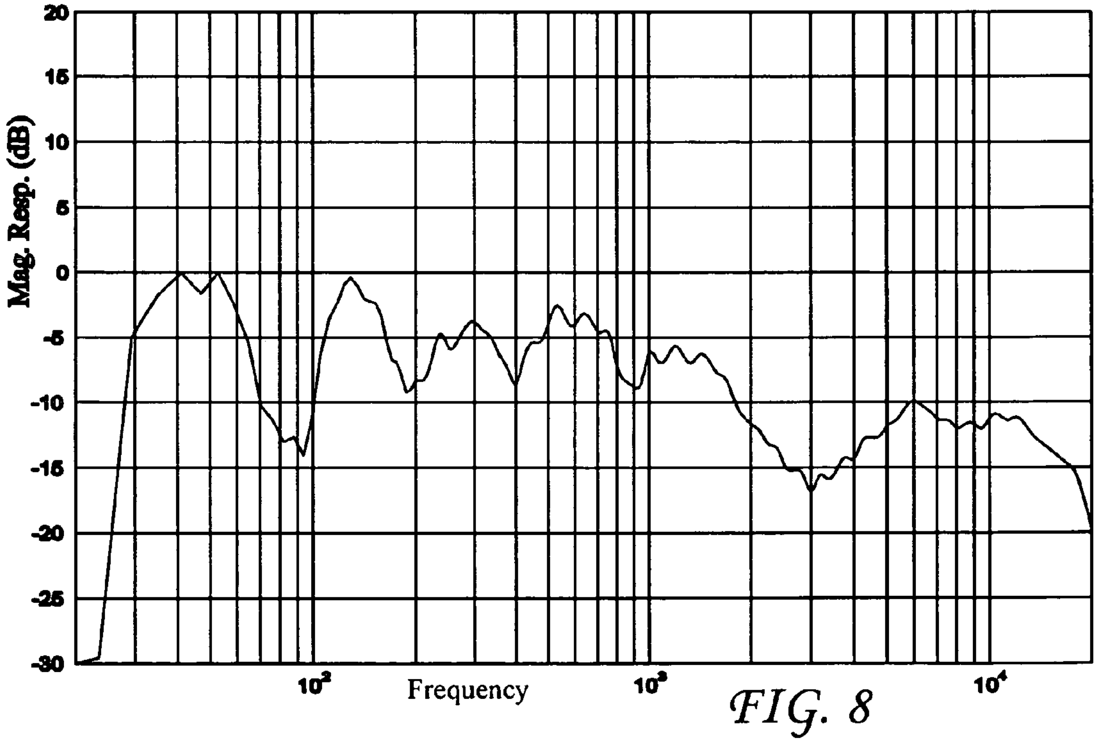
FIG. 8 is a third octave smoothed magnitude response corresponding to FIG. 7.
Figure 9:
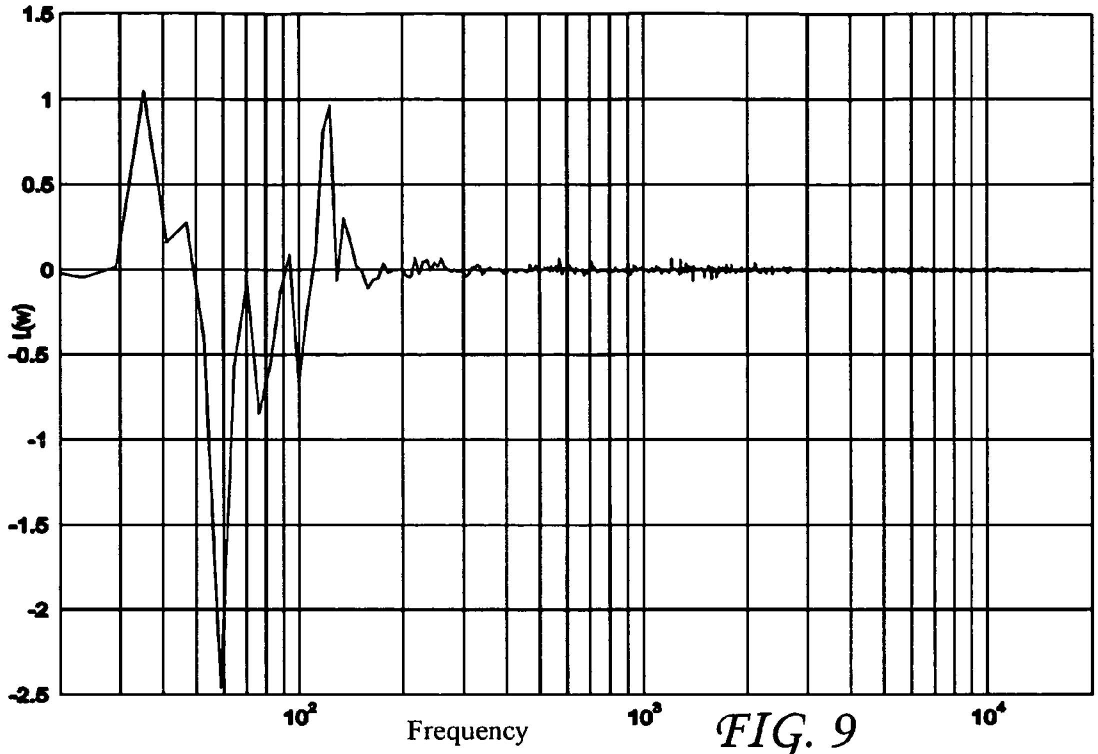
FIG. 9 shown the effect of phase incoherence.
Figure 10:
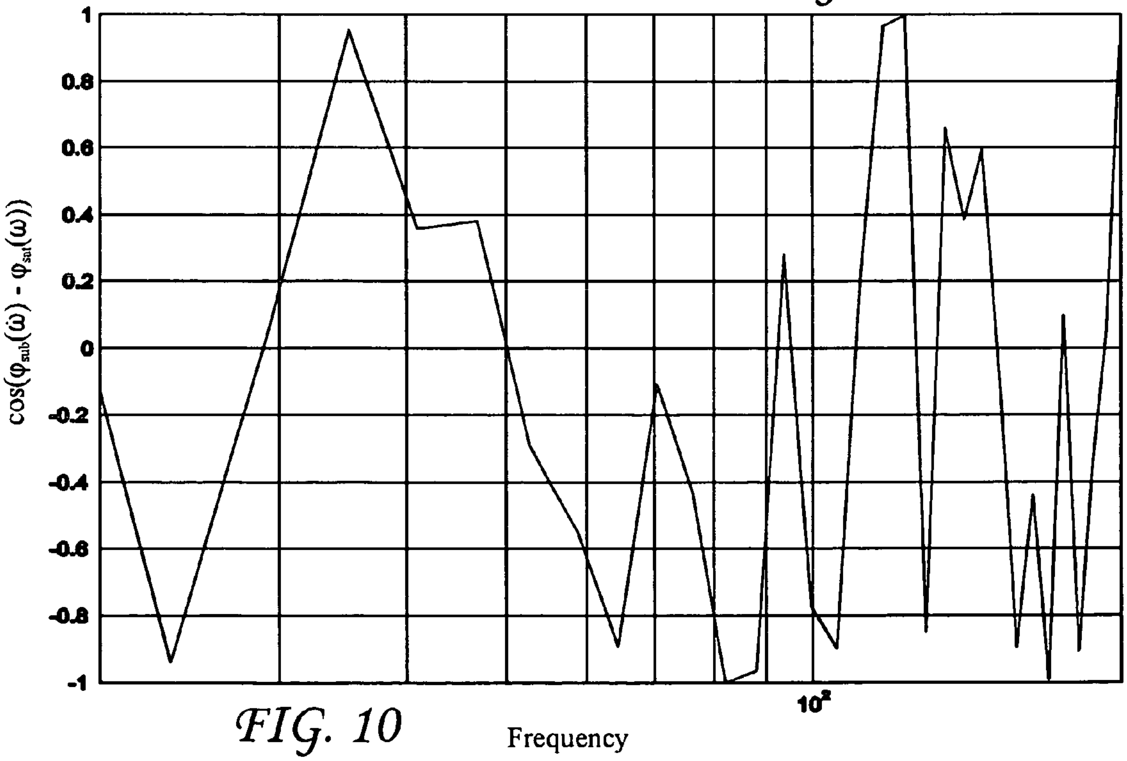
FIG. 10 shows the net reduction in magnitude response due to phase incoherence.

The resulting magnitude response is actually the difference between the magnitude responses of the subwoofer and satellite speaker thereby, possibly introducing a spectral notch 50 around the cross-over frequency. For example, FIG. 7 shows an exemplary combined subwoofer and center channel speaker response in a room with reverberation time of about 0.75 seconds. Clearly, a large spectral notch is observed around the cross-over frequency, and one of the reasons for the introduction of this cross-over notch is the additive term $\Lambda(e^{j\omega})$ which adds incoherently to the magnitude response sum. FIG. 8 is a third octave smoothed magnitude response corresponding to FIG. 7, or as FIG. 9 shows the effect of the $\Lambda(e^{j\omega})$ term clearly exhibiting an inhibitory effect around the cross-over region due to the phase interaction between the subwoofer and the satellite speaker response at the listener position 24 (see FIG. 1). The cosine of the phase difference (viz., $\cos(\phi_{sub}(\omega)-\phi_{sat}(\omega))$), that causes the reduction in net magnitude response, is shown in FIG. 10. Thus, properly selecting $\Lambda(e^{j\omega})$ term provides improved net magnitude response in the cross-over region.

The present invention describes a method for attenuation of the spectral notch. All-pass filters 60*a*-60*e* may be included in the signal processor 12. The all-pass filters 60*a*-60*e* have unit magnitude response across the frequency spectrum, while introducing frequency dependent group delays (e.g., frequency shifts). The all-pass filters 60*a*-60*e* are preferably cascaded with the high pass filters 30*a*-30*e* and are preferably M-cascade all-pass filters $A_M(e^j)$ where each section in the cascade comprises a second order all-pass filter. A family of all-pass filter unwrapped phases as a function of frequency is plotted in FIG. 11.

Figure 11:
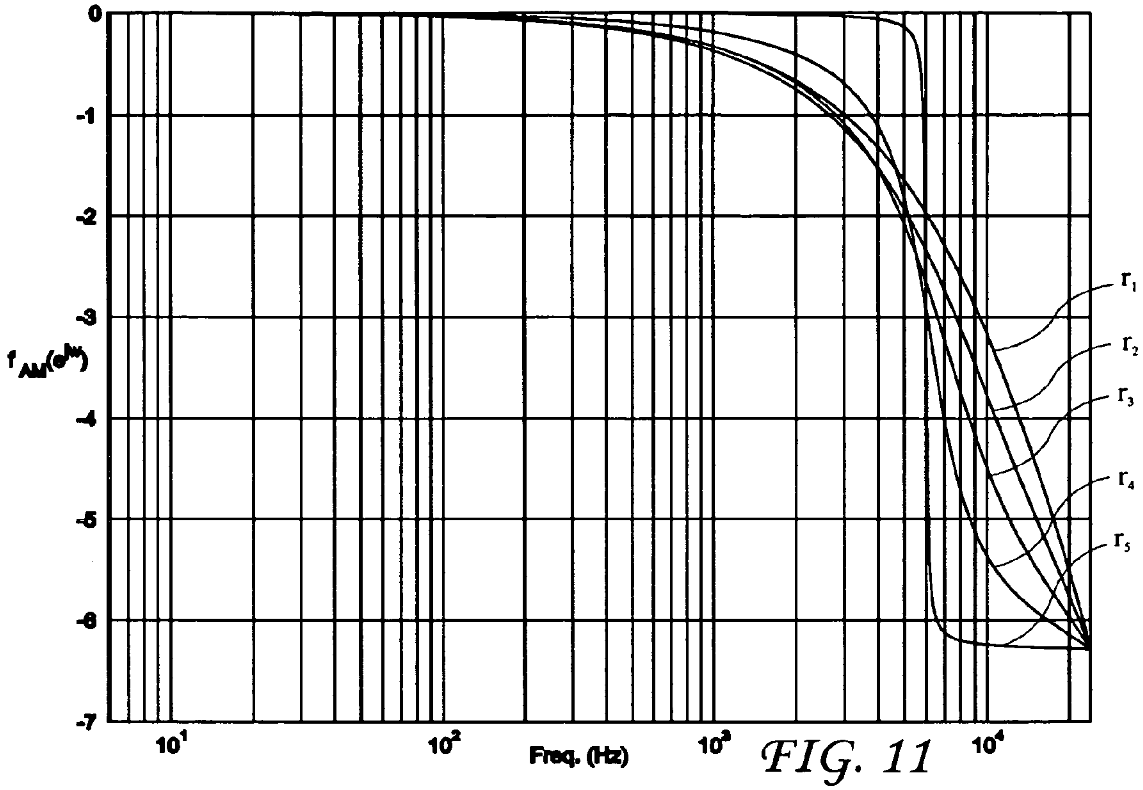
FIG. 11 is a family of unwrapped phases for all-pass filters.
Figure 12:
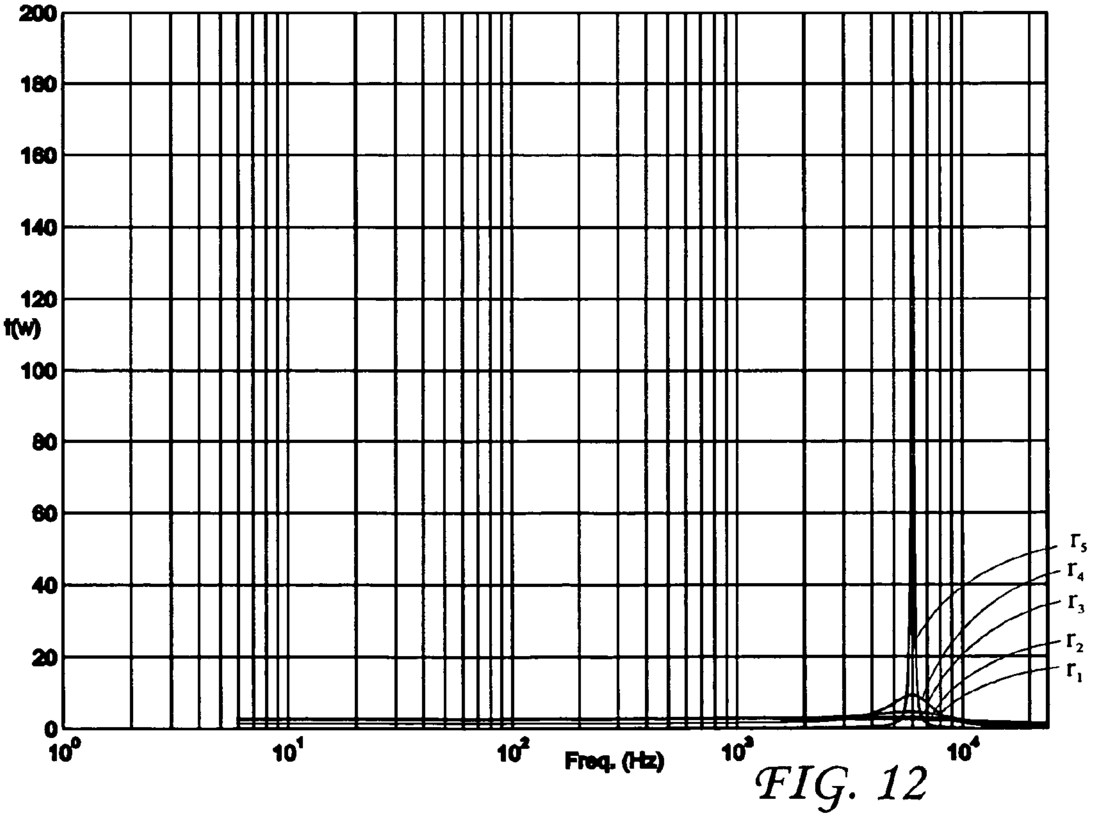
FIG. 12 shows group delays for the all-pass filters.

A second order all-pass filter, A(z) may be expressed as:

$$A(z)=\frac{z^{-1}-z_i^t}{1-z_iz^{-1}}\,\frac{z^{-1}-z_i}{1-z_i^tz^{-1}}\Big|_{z=e^{j\omega}}$$

where $z_i=r_ie^{j\theta_i}$ is a poll of angle $\theta i\in(0, 2\pi)$ and radius $r_i$. FIG. 11 shows the unwrapped phase (viz., arg(Ap(z))) for $r_1$ of 0.2, $r_2$ of 0.4, $r_3$ of 0.6, $r_4$ of 0.8, and $r_5$ of 0.99. and $\theta i=0.25\pi$. Whereas FIG. 12 shows the group delay plots for the same radii. As can be observed, the closer the poll is to the unit circle (i.e., to 1), the larger the group delay is (i.e., the larger the phase angle is). One of the main advantages of an all-pass filter is that the magnitude response is unity at all frequencies, thereby not changing the magnitude response of the overall cascaded filter result.

To combat the effects of incoherent addition of the Λ term, it is preferable to include the first order all-pass filter in the satellite channel (e.g., center channel). In contrast, if the all-pass filter were to be placed in the subwoofer channel, the net response between the subwoofer and the remaining channels (e.g., left front, right front, left rear, and/or right rear,) could be affected and undesirable manner. Thus, the all-pass filter is cascaded with the satellite speaker signal processing (e.g., the bass-management filter) to reduce or remove the effects of phase between each satellite speaker and the subwoofer at a particular listening position. Further, the method of the present invention may be adapted to include information describing the net response at multiple listening positions so as to optimize the Λ term in order to minimize the effects of phase interaction over multiple positions.

The attenuation of the spectral notch is achieved by adaptively minimizing a phase term:

$$\phi_{sub}(\omega)-\phi_{speaker}(\omega)-\phi_{A_M}(\omega)$$

where:

$\phi_{sub}(\omega)$=the phase spectrum for the subwoofer 22;

$\phi_{speaker}(\omega)$=the phase spectrum for the satellite speakers 16, 18*a*, 18*b*, 20*a*, or 20*b*; and $\phi_{A_M}(\omega)$=the phase spectrum of the all-pass filter.

Further, the net response $|H(e^{j\omega})|^2$ of a subwoofer and satellite speaker suite having an M-cascade all-pass filter $A_M(e^{j\omega})$ in the satellite speaker channel may be expressed as:

$$|H(e^{j\omega})|^2=\left|\tilde{H}_{sub}(\omega)\right|^2+\left|\tilde{H}_{sat}(\omega)\right|^2+2\left|\tilde{H}_{sub}(\omega)\right|\cdot\left|\tilde{H}_{sat}(\omega)\right|\cdot\cos(\phi_{sub}(\omega)-\phi_{sat}(\omega)-\phi_{A_M}(\omega))$$

where the M cascade all-pass filter $A_M$ may be expressed as:

$$A_M(e^{j\omega})=\Pi_{k=1}^{M}\frac{e^{-j\omega}-r_ke^{-j\theta_k}}{1-r_ke^{j\theta_k e}-e^{-j\omega}}\cdot\frac{e^{-j\omega}-r_ke^{j\theta_k}}{1-r_ke^{j\theta_k}e^{-j\omega}}$$

$$\phi_{A_M}(\omega)=\sum_{k=1}^{M}\phi_{A_M}^{(k)}(\omega)$$

$$\phi_{A_M}^{(i)}=-2\omega-2\tan^{-1}\left(\frac{r_i\sin(\omega-\theta_i)}{1-r_i\cos(\omega-\theta_i)}\right)-2\tan^{-1}\left(\frac{r_i\sin(\omega+\theta_i)}{1-r_i\cos(\omega+\theta_i)}\right)$$

and the additive term $\Lambda_F(e^{j\omega})$ may be expressed as:

$$\Lambda_F(e^{j\omega})=2|\tilde{H}_{sub}(\omega)|\cdot|\tilde{H}_{sat}(\omega)|\cdot\cos(\phi_{sub}(\omega)-\phi_{sat}(\omega)-\phi_{A_M}(\omega))$$

Thus, to minimize the negative affect of the Λ term, (or effectively cause Λ to add coherently to $|\tilde{H}_{sub}(\omega)|^2+|\tilde{H}_{sat}(\omega)|^2$, in the example above, a preferred objective function, J(n) may be defined as:

$$J(n)=\frac{1}{N}\sum_{i=1}^{N}W(\omega_i)(\phi_{sub}(\omega)-\phi_{speaker}(\omega)-\phi_{A_M}(\omega))^2$$

Where $W(\omega_i)$ is a frequency dependent weighting function. The terms $r_i$ and $\theta_i$, (i=1, 2, 3, . . . M) may be determined using an adaptive recursive formula by minimizing the objective function J(n) with respect to $r_i$ and $\theta_i$. The recursive update equations are:

$$r_i(n+1)=r_i(n)-\frac{\mu_r}{2}\Delta_{r_i}J(n);\quad\text{and}\quad\theta_i(n+1)=\theta_i(n)-\frac{\mu_\theta}{2}\Delta_{\theta_i}J(n)$$

where $\mu_r$ and $\mu_\theta$ are adaptation rate control parameters chosen to guarantee stable convergence and are typically between zero and one. Finally, the gradients of the objective function J(n) with respect to the parameters of the all-pass function is are:

$$\nabla_{r_i}J(n)=\sum_{l=1}^{N}W(\omega_1)E(\phi(\omega))(-1)\frac{\delta\phi_{A_M}(\omega)}{\delta r_i(n)}\quad\text{and,}$$

$$\nabla_{\theta_l}J(n)=\sum_{l=1}^{N}W(\omega_1)E(\phi(\omega))(-1)\frac{\delta\phi_{A_M}(\omega)}{\delta\theta_i(n)}\quad\text{where:}$$

$$E(\phi(\omega))=\phi_{subwoofer}(\omega)-\phi_{speaker}(\omega)-\phi_{A_M}(\omega)\text{ and where:}$$

$$\frac{\delta\phi_{A_M}(\omega)}{\delta\theta_i(n)}=$$

-continued $$\frac{2r_i(n)(r_i(n)-\cos(\omega_l-\theta_i(n)))}{r_i^2(n)-2r_i(n)\cos(\omega_l-\theta_i(n))+1}-\frac{2r_i(n)(r_i(n)-\cos(\omega_l+\theta_i(n)))}{r_i^2(n)-2r_i(n)\cos(\omega_l+\theta_i(n))+1}$$

and, $$\frac{\delta\phi_{A_M}(\omega)}{\delta r_i(n)}=\frac{2\sin(\omega_l-\theta_i(n))}{r_i^2(n)-2r_i(n)\cos(\omega_l-\theta_i(n))+1}-\frac{2\sin(\omega_l+\theta_i(n))}{r_i^2(n)-2r_i(n)\cos(\omega_l+\theta_i(n))+1}$$

In order to guarantee stability, the magnitude of the pole radius $r_i(n)$ is preferably kept less than one. A preferable method for keeping the magnitude of the pole radius $r_i(n)$ less than one is to randomize $r_i(n)$ between zero and one whenever $r_i(n)$ is greater than or equal to one.

For the combined subwoofer and center channel speaker response shown in FIG. 7, the $r_i$ and $\theta_i$ with M=9 adapted to a reasonable minimization of J(n). Furthermore, the frequency dependent weighting function, $W(\omega_1)$, for the above example was chosen as unity for frequencies between 60 Hz and 125 Hz. The reason for this choice of weighting terms is apparent from the domain of $\Lambda(e^{j\omega})$ term in FIG. 12 and/or the domain of the "suckout" term in FIG. 11.

Figure 13:
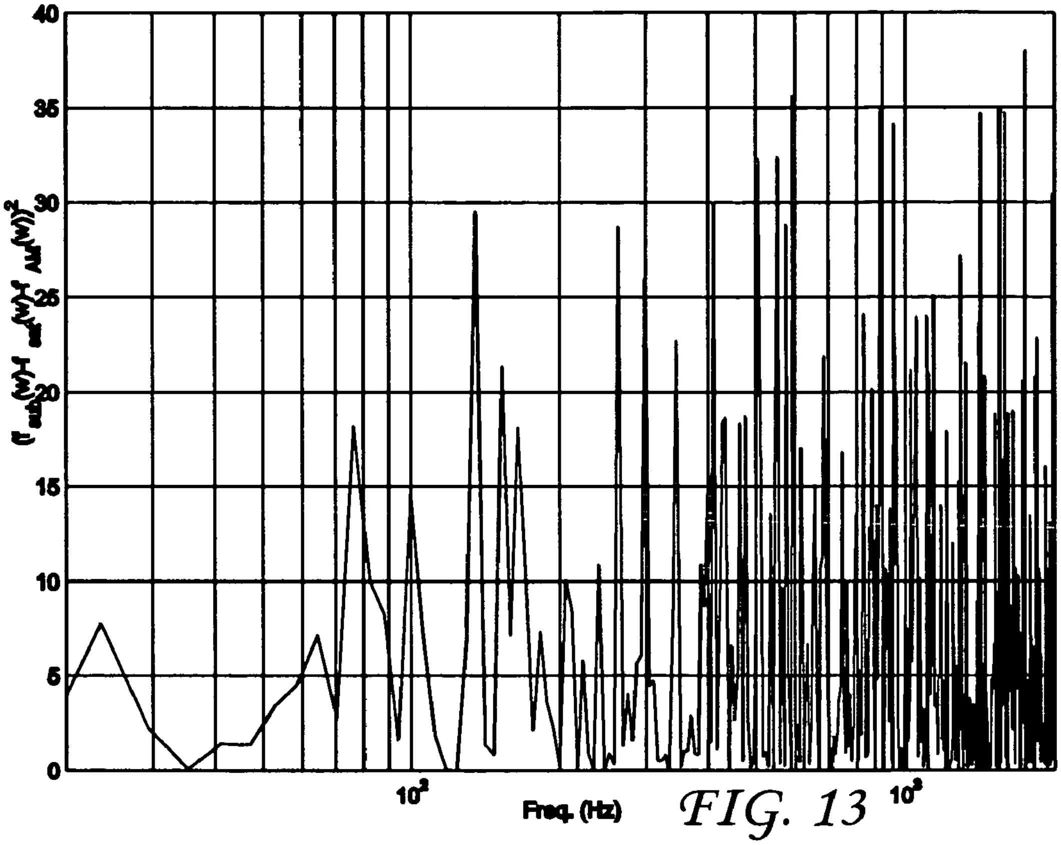
FIG. 13 is an original phase difference function.
Figure 14:
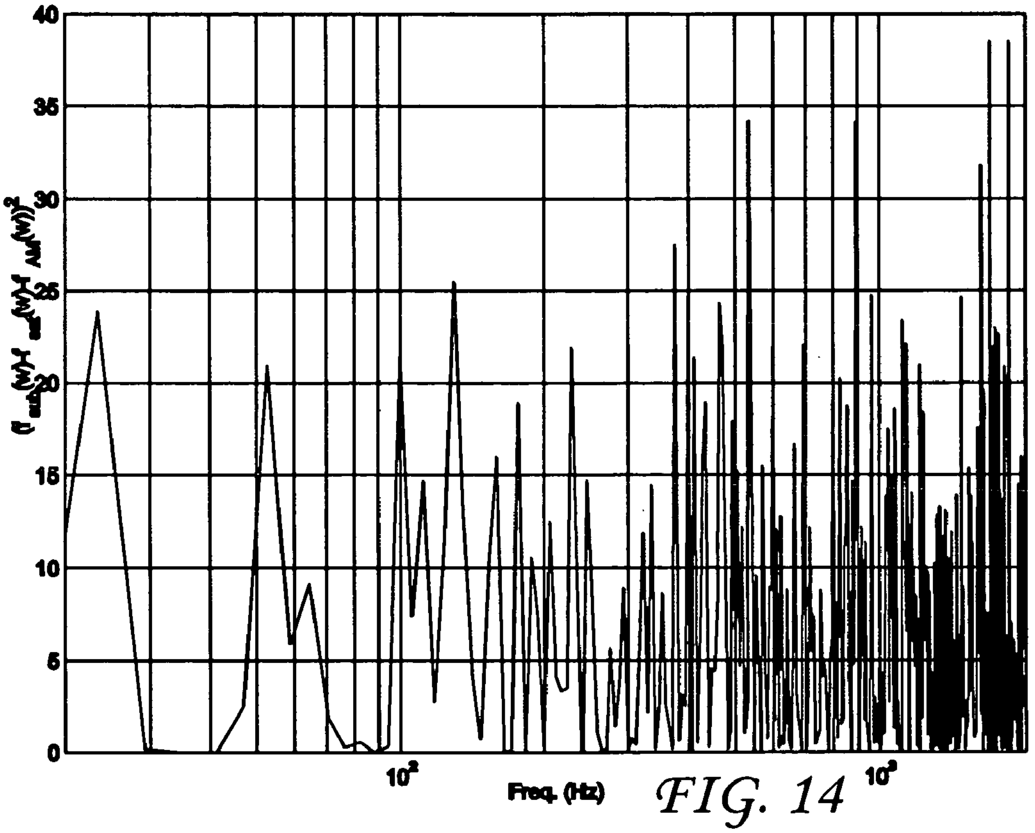
FIG. 14 is a phase difference function after all-pass filtering.
Figure 15:
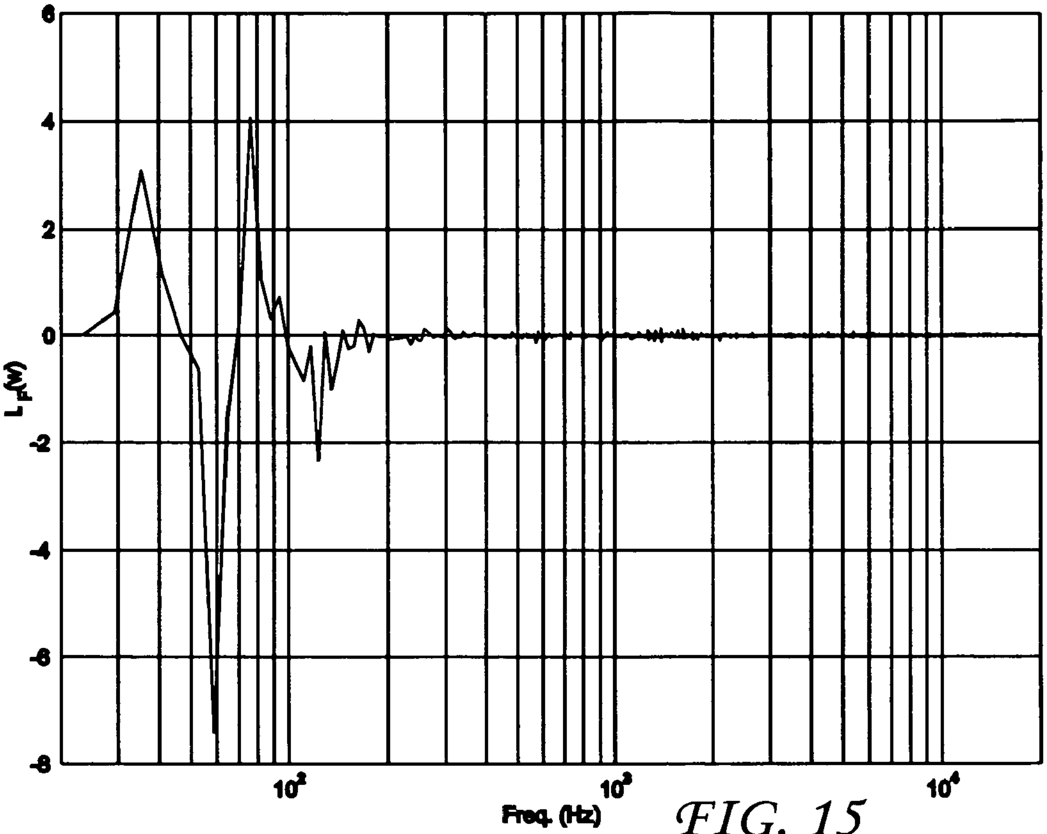
FIG. 15 is the phase correction introduced by the all-pass filtering.
Figure 16:
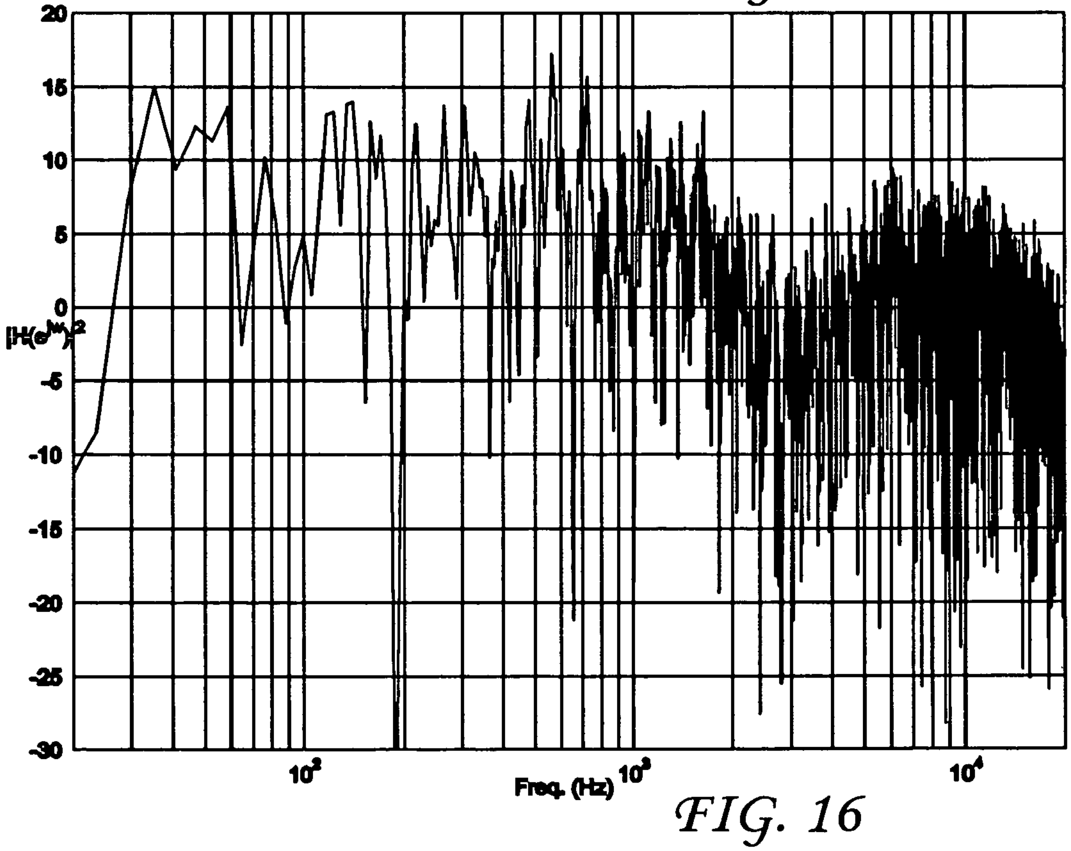
FIG. 16 is the net magnitude response in the cross-over region resulting from the all-pass filtering
Figure 17:
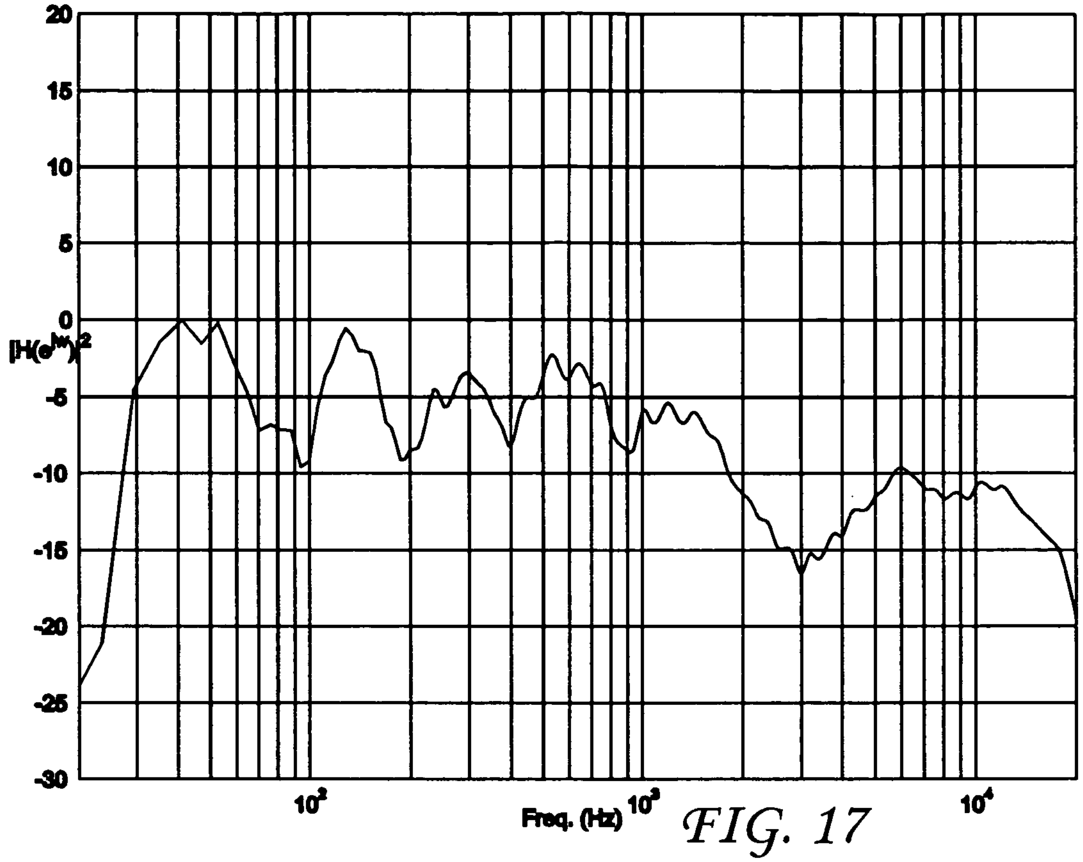
FIG. 17 is a third octave smoother representation of FIG. 16.
Figure 18:
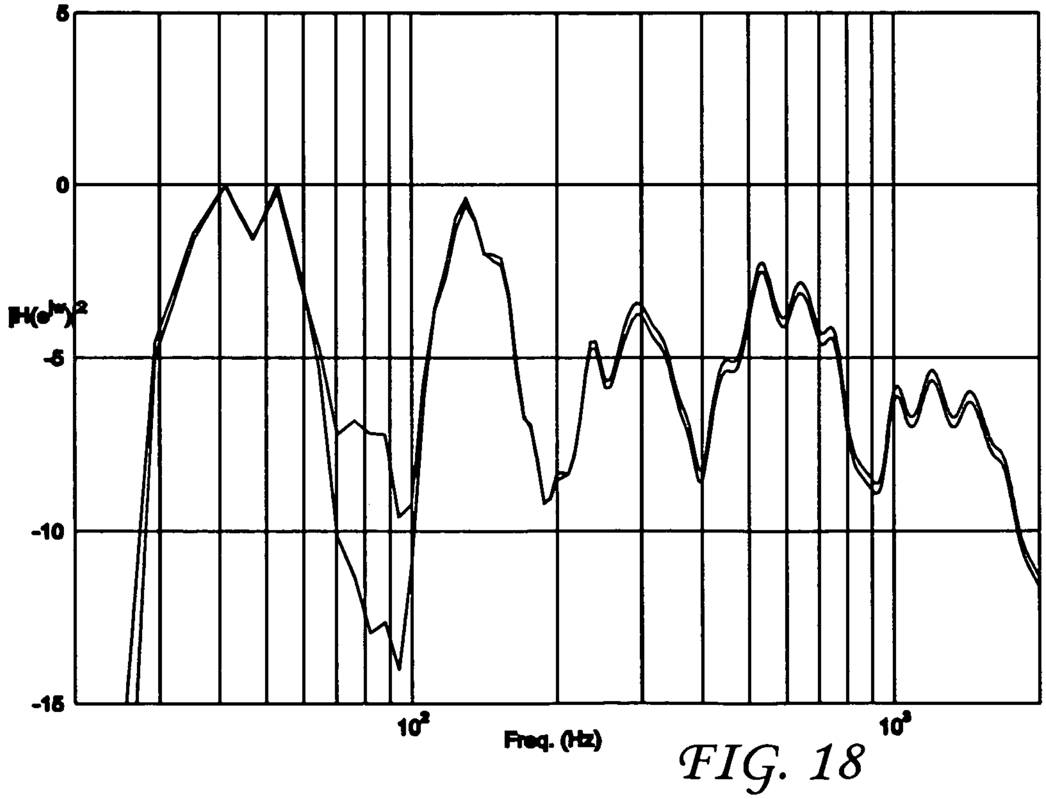
FIG. 18 is a plot of the third octave smoother representation superimposed on the third octave smoother before all-pass filtering.

The original phase difference function $(\phi_{sub}(\omega)-\phi sat(\omega))^2$ is plotted in FIG. 13 and the cosine term $\cos(\phi_{sub}(\omega)-\phi_{sat}(\omega))$ which shows incoherent shown in FIG. 10 as can be seen, by minimizing the phase difference (using all-pass filter cascaded in the satellite channel) around the cross-over region will minimize the spectral notch. The resulting all-pass filter and phase difference function $(\phi_{sub}(\omega)-\phi_{sat}(\omega)-\phi_{A_M}(\omega))^2$, resulting from the adaptation of $r_i$ (n) and $\theta_i(n)$ is shown in FIG. 14, thereby demonstrating the minimization of the phase difference around the cross-over. The resulting all-pass filtering term, $\Lambda_F(\omega)$, and is shown in FIG. 15. Comparing FIGS. 9 and 15, it may be seen that the inhibition turns to an excitation to the net magnitude response around the cross-over region. Finally, FIG. 16 shows the resulting combined magnitude response with the cascade all-pass filter in the satellite channel, and FIG. 17 shows the third octave smoothed version of FIG. 16. A superimposed plot, comprising FIG. 17 and the original combined response of FIG. 8 is depicted in FIG. 18 and an improvement of about 70 be around the cross-over may be seen.

Figure 19:
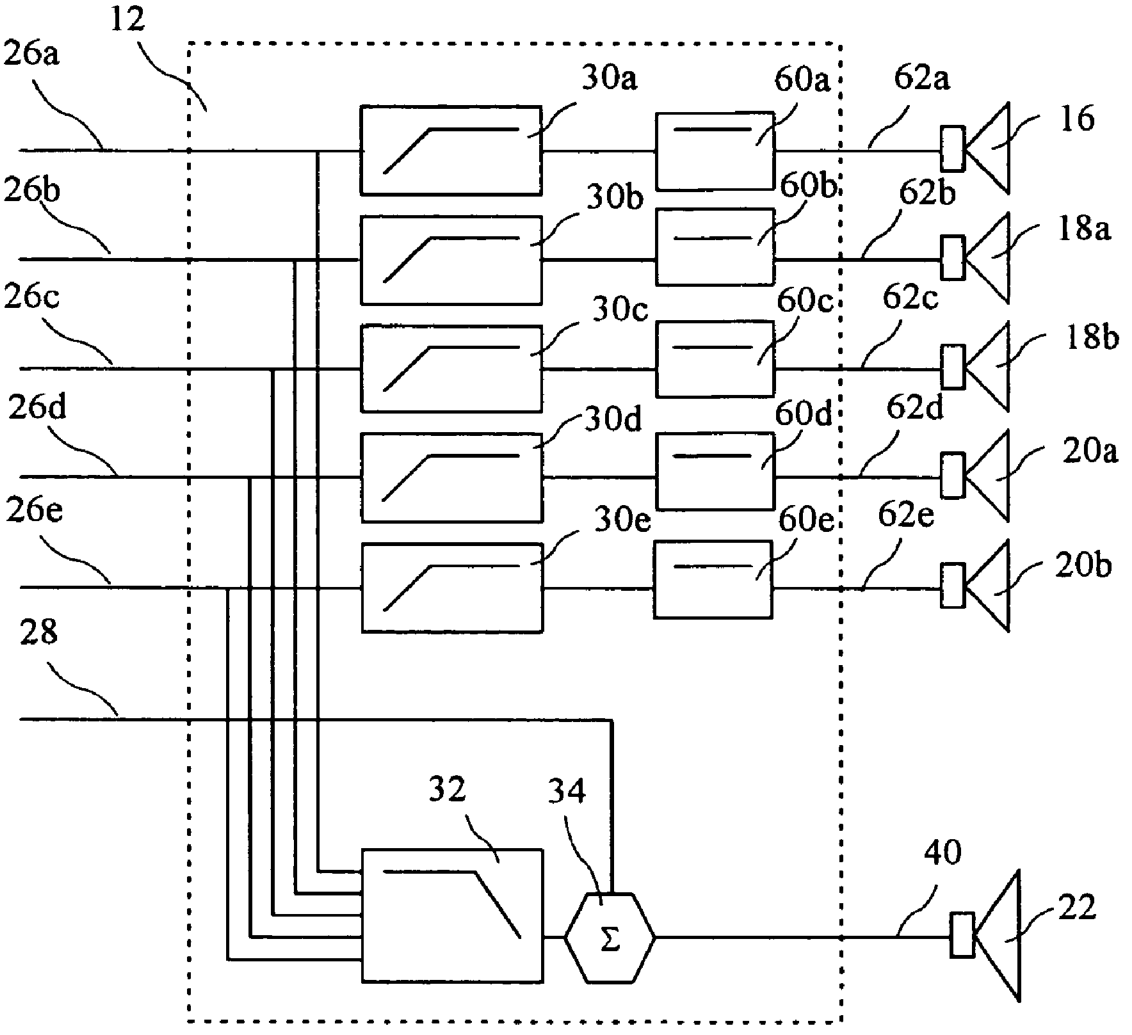
FIG. 19 is a signal processor flow according to the present invention including all-pass filters.

A processing flow diagram for the present invention is shown in FIG. 19. All-pass filters 60*a*-60*e* are cascaded with high pass (or bass-management) filters 30*a*-30*e*.

Figure 20:
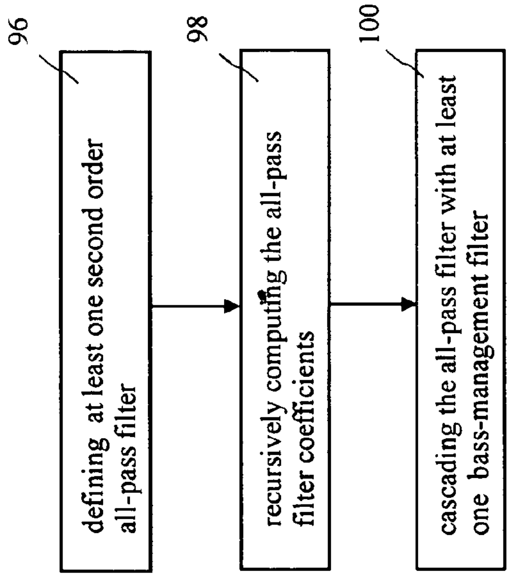
FIG. 20 is a method according to the present invention.

A method according to the present invention is described in FIG. 20. The method comprises defining at least one second order all-pass filter at step 96, recursively computing all-pass filter coefficients at step 98, and cascading the at least one all-pass filter with at least one bass-management filter at step 100. The at least one all-pass filter is preferably a plurality of all-pass filters and are preferably cascaded with high-pass filters processing signals for satellite speakers 16, 18*a*, 18*b*, 20*a*, and 20*b* shown in FIG. 1.

Figure 21:
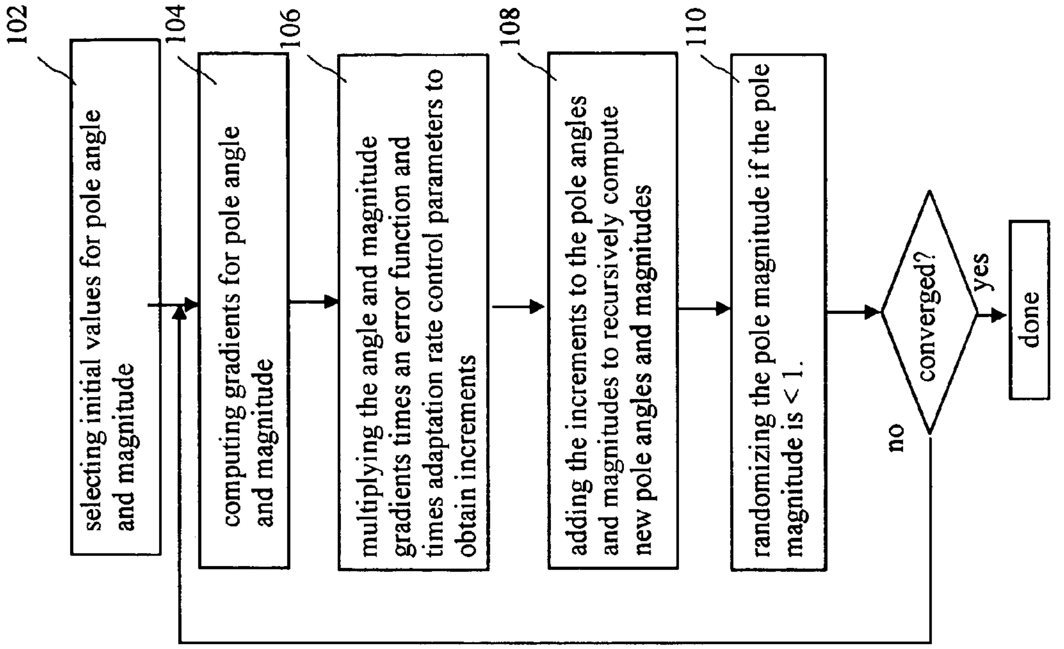
FIG. 21 is a method for computing all-pass filter coefficients according to the present invention.

The recursively computing all-pass filter weights step 98, preferably comprises a computing methods described in FIG. 21. The computing method comprises the steps of selecting initial values for pole angles $\theta_i$ and magnitudes $r_i$ at step 102, computing gradients $\nabla_{ri}$ and $\nabla_{\theta i}$ for pole angle and magnitude at step 104, multiplying the angle and magnitude gradients $\nabla_{ri}$ and $\nabla_{\theta i}$ times an error function J(n) and times adaptation rate control parameters $\mu_r$ and $\mu_\theta$ to obtain increments at step 106, adding the increments to the pole angles and magnitudes to recursively compute new pole angles and magnitudes at step 108, randomizing the pole magnitude if the pole magnitude is <1 at step 110, and testing to determine if the pole angle and magnitudes have converged at step 112. If the pole angle and magnitudes have converged, the computing method is done, otherwise, the steps 104, 106, 108, 110, and 112 are repeated.

The methods of the present invention may further include a method for selecting an optimal cross-over frequency including the steps of measuring the full-range (i.e., non bass-managed) subwoofer and satellite speaker response in at least one position in a room, selecting a cross-over region, selecting a set of candidate cross-over frequencies and corresponding bass-management filters for the subwoofer and the satellite speaker, applying the corresponding bass-management filters to the subwoofer and satellite speaker full-range response, level matching the bass managed subwoofer and satellite speaker response, performing addition of the subwoofer and satellite speaker response to obtain the net bass-managed subwoofer and satellite speaker response, computing an objective function using the net response for each of the candidate cross-over frequencies, and selecting the candidate cross-over frequency resulting in the lowest objective function.

While the invention herein disclosed has been described by means of specific embodiments and applications thereof, numerous modifications and variations could be made thereto by those skilled in the art without departing from the scope of the invention set forth in the claims.

We claim:

1. A method for minimizing the spectral deviations in the cross-over region of a combined bass-managed subwoofer-room and bass-managed satellite-room response, the method comprising:

defining at least one second order all-pass filter having all-pass filter coefficients selectable to reduce incoherent addition of acoustic signals produced by the subwoofer and the satellite speaker;

recursively computing the all-pass filter coefficients to minimize a phase response error, the phase response error being a function of phase responses of a subwoofer-room response, a satellite-room response, and the subwoofer and satellite bass-management filter responses; and cascading the all-pass filter with at least one of the satellite speaker bass-management filter and subwoofer bass-management filter;

wherein computing the all-pass filter coefficients comprises:

selecting initial values for pole angles and magnitudes;

computing gradients $\nabla_{ri}$ and $\nabla_{\theta i}$ for pole angle and magnitude;

multiplying the angle and magnitude gradients $\nabla_{ri}$ and $\nabla_{\theta i}$ times an error function J(n) and times adaptation rate control parameters $\mu_r$ and $\mu_\theta$ to obtain increments;

adding the increments to the pole angles and magnitudes to recursively compute new pole angles and magnitudes;

randomizing the pole magnitude if the pole magnitude is <1; and testing to determine if the pole angle and magnitudes have converged, wherein if the if the pole angle and magnitudes have converged, the computing method is done, otherwise, the steps stating with computing gradients are repeated.

2. The method of claim 1, wherein the gradients include frequency dependent weighting terms.

3. The method of claim 1, wherein the error function J(n) is an average square error function of phase difference between the subwoofer phase, the satellite speaker phase, and the all-pass filter phase.

4. The method of claim 1, wherein the average square error function includes a frequency dependent weighting.

5. The method of claim 1, further including steps for optimizing the crossover frequency, comprising:

measuring a full-range subwoofer and satellite speaker response in at least one position in a room;

selecting a cross-over region;

selecting a set of candidate cross-over frequencies and corresponding bass-management filters for the subwoofer and the satellite speaker;

applying corresponding bass-management filters to the full-range subwoofer and satellite speaker response to obtain bass managed subwoofer and satellite speaker responses;

level matching the bass managed subwoofer and satellite speaker responses to obtain leveled subwoofer and satellite speaker responses;

summing the leveled subwoofer and satellite speaker responses to obtain a net bass-managed subwoofer and satellite speaker response;

computing an objective function using the net bass-managed subwoofer and satellite speaker response for each of the candidate cross-over frequencies; and selecting the candidate cross-over frequency resulting in the lowest objective function.

6. A signal processor for minimizing the spectral deviations in the cross-over region of a combined bass-managed subwoofer-room and bass-managed satellite-room response comprising:

at least one second order all-pass filter, the at least one second order all-pass filter having all-pass filter coefficients selectable to reduce incoherent addition of acoustic signals produced by the subwoofer and the satellite speaker, the all-pass filter coefficients recursively computed to minimize a phase response error, the phase response error being a function of phase responses of a subwoofer-room response, a satellite-room response, and the subwoofer and satellite bass-management filter responses; and at least one satellite speaker bass-management filter cascaded with the all-pass filter and a subwoofer bass-management filter;

wherein the all-pass filter coefficients are computed by selecting initial values for pole angles and magnitudes;

computing gradients $\nabla_{ri}$ and $\nabla_{\theta i}$ for pole angle and magnitude;

multiplying the angle and magnitude gradients $\nabla_{ri}$ and $\nabla_{\theta i}$ times an error function J(n) and times adaptation rate control parameters $\mu_r$ and $\mu_\theta$ to obtain increments;

adding the increments to the pole angles and magnitudes to recursively compute new pole angles and magnitudes;

randomizing the pole magnitude if the pole magnitude is <1; and testing to determine if the pole angle and magnitudes have converged, wherein if the if the pole angle and magnitudes have converged, the computing method is done, otherwise, the steps stating with computing gradients are repeated.

7. The signal processor of claim 6, wherein the gradients include frequency dependent weighting terms.

8. The signal processor of claim 6, wherein the error function J(n) is an average square error function of phase difference between the subwoofer phase, the satellite speaker phase, and the all-pass filter phase.

9. The signal processor of claim 6, wherein the average square error function includes a frequency dependent weighting.

10. The signal processor of claim 6, wherein the crossover frequency is optimized by measuring a full-range subwoofer and satellite speaker response in at least one position in a room;

selecting a cross-over region;

selecting a set of candidate cross-over frequencies and corresponding bass-management filters for the subwoofer and the satellite speaker;

applying corresponding bass-management filters to the full-range subwoofer and satellite speaker response to obtain bass managed subwoofer and satellite speaker responses;

level matching the bass managed subwoofer and satellite speaker responses to obtain leveled subwoofer and satellite speaker responses;

summing the leveled subwoofer and satellite speaker responses to obtain a net bass-managed subwoofer and satellite speaker response;

computing an objective function using the net bass-managed subwoofer and satellite speaker response for each of the candidate cross-over frequencies; and selecting the candidate cross-over frequency resulting in the lowest objective function.

* * * * *

UNITED STATES PATENT AND TRADEMARK OFFICE

CERTIFICATE OF CORRECTION

PATENT NO. : 7,720,237 B2
APPLICATION NO. : 11/222000
DATED : May 18, 2010
INVENTOR(S) : Sunil Bharitkar and Chris Kyriakakis It is certified that error appears in the above-identified patent and that said Letters Patent is hereby corrected as shown below:

In the claims

Column 10, lines 31-65, please amend the claim as follows:

1. A method for minimizing the spectral deviations in the cross-over region of a combined bass-managed subwoofer-room and bass-managed satellite-room response, the method comprising:

defining at least one second order all-pass filter having all-pass filter coefficients selectable to reduce incoherent addition of acoustic signals produced by the subwoofer and the satellite speaker;

recursively computing the all-pass filter coefficients to minimize a phase response error, the phase response error being a function of phase responses of a subwoofer-room response, a satellite-room response, and the subwoofer and satellite bass-management filter responses; and cascading the all-pass filter with at least one of the satellite speaker bass-management filter and subwoofer bass-management filter;

wherein computing the all-pass filter coefficients comprises:

selecting initial values for pole angles and magnitudes;

computing gradients $\nabla_{ri}$ and $\nabla_{\theta i}$ for pole angle and magnitude;

multiplying the angle and magnitude gradients $\nabla_{ri}$ and $\nabla_{\theta i}$ times an error function J(n) and times adaptation rate control parameters $\mu_r$ and $\mu_\theta$ to obtain increments;

adding the increments to the pole angles and magnitudes to recursively compute new pole angles and magnitudes;

randomizing the pole magnitude if the pole magnitude is < 1; and testing to determine if the pole angle and magnitudes have converged, wherein if the ~~if the~~ pole angle and magnitudes have converged, the computing method is done, otherwise, the steps ~~stating~~ starting with computing gradients are repeated.

Column 11, line 30 through Column 12, line 15, Claim 6 should read:

6. A signal processor for minimizing the spectral deviations in the cross-over region of a combined bass-managed subwoofer-room and bass-managed satellite-room response comprising:

at least one second order all-pass filter, the at least one second order all-pass filter having all-pass filter coefficients selectable to reduce incoherent addition of acoustic signals produced by the subwoofer and the satellite speaker, the all-pass filter coefficients recursively computed to minimize a phase response error, the phase response error being a function of Signed and Sealed this Seventeenth Day of August, 2010

David J. Kappos

*Director of the United States Patent and Trademark Office* phase responses of a subwoofer-room response, a satellite-room response, and the subwoofer and satellite bass-management filter responses; and at least one satellite speaker bass-management filter cascaded with the all-pass filter and a subwoofer bass-management filter;

wherein the all-pass filter coefficients are computed by selecting initial values for pole angles and magnitudes;

computing gradients $\nabla_{ri}$ and $\nabla_{\theta i}$ for pole angle and magnitude;

multiplying the angle and magnitude gradients $\nabla_{ri}$ and $\nabla_{\theta i}$ times an error function J(n) and times adaptation rate control parameters $\mu_r$ and $\mu_\theta$ to obtain increments;

adding the increments to the pole angles and magnitudes to recursively compute new pole angles and magnitudes;

randomizing the pole magnitude if the pole magnitude is $< 1$; and testing to determine if the pole angle and magnitudes have converged, wherein if the ~~if the~~ pole angle and magnitudes have converged, the computing method is done, otherwise, the steps ~~stating~~ starting with computing gradients are repeated.